(12) United States Patent
Bobba et al.

(10) Patent No.: US 6,563,336 B1
(45) Date of Patent: May 13, 2003

(54) SIGNAL SHIELDING ASSIGNMENT TECHNIQUE FOR PRECHARGE BASED LOGIC

(75) Inventors: Sudhakar Bobba, Sunnyvale, CA (US); Tyler Thorp, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/071,365

(22) Filed: Feb. 6, 2002

(51) Int. Cl.$^7$ ............................................... H03K 17/16
(52) U.S. Cl. ......................................................... 326/26
(58) Field of Search ........................... 326/101, 82, 21, 326/26, 41, 95, 98

(56) References Cited

U.S. PATENT DOCUMENTS 5,436,573 A * 7/1995 Ogawa et al. ................. 326/17
5,910,735 A * 6/1999 Allen ............................ 326/93
6,184,702 B1 * 2/2001 Takahashi et al. ............ 326/21
6,285,208 B1 * 9/2001 Ohkubo ....................... 326/15

* cited by examiner

*Primary Examiner*—Daniel D. Chang
(74) *Attorney, Agent, or Firm*—Rosenthal & Osha L.L.P.

(57) ABSTRACT

A signal shielding technique that assigns voltage potential to shield wires based on the dominant switching direction of a signal is provided. The dominant switching direction is determined based on pre-charge based logic that drives the signal. By determining the voltage potential the signal is more likely to transition to, the shield wires can be implemented so that a discharge event occurs during the dominant transition. Because the signal is more likely to switch in the dominant switching direction, power supply collapses associated with charging events may be reduced.

10 Claims, 6 Drawing Sheets

SIGNAL SHIELDING ASSIGNMENT TECHNIQUE FOR PRECHARGE BASED LOGIC

BACKGROUND OF INVENTION

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer system (10) having a microprocessor (12), memory (14), integrated circuits (16) that have various functionalities, and communication paths (18), i.e., buses and wires, that are necessary for the transfer of data among the aforementioned components of the computer system (10).

The various computations and operations performed by the computer system are facilitated through the use of signals that provide electrical pathways for data to propagate between the various components of the computer system. In a general sense, the passing of data onto a signal may occur by either raising the voltage of the signal or reducing the voltage of the signal. When the voltage is raised, the signal is said to be at a "logic high," and when the voltage is reduced, the signal is said to be at a "logic low." Changes in the voltage value of a signal are accomplished by charging and discharging capacitors associated with the signal wire on which the signal resides. A capacitor with a potential difference across its terminals is considered to be a charged capacitor, and a capacitor with no potential difference across its terminals is considered to be a discharged capacitor. Therefore, a charging event is described as a process by which potential difference is created across the terminals of a capacitor by delivering charge to the capacitor. A discharging event is described as a process by which the potential difference across the terminals of a capacitor is removed by removing the charge stored in the capacitor.

Because signals within an integrated circuit are often in close proximity to each other, there is a propensity for the behavior of one signal to affect the behavior of another signal. This occurs due to intrinsic capacitances (also referred to and known as "cross-coupling capacitance") that develop between signals at different logic levels. For example, some amount of cross-coupling capacitance is likely to develop between two signals that are relatively close together, where one signal is at a logic high and the other is at a logic low. When one of the signals switches state, noise may be injected on the other signal, causing the other signal to glitch, i.e., an electrical spike occurs. Such undesired behavior on the non-switching signal may lead to performance degradation because the noise injected on the non-switching signal can propagate to other parts of the processor causing timing failures and/or circuit malfunction.

An approach that designers have used to combat such cross-coupling capacitance induced behavior involves the use of wires to "shield" a signal from other signals. The purpose of shielding is to place wires next to the signal wire that do not make any transitions. To this end, FIG. 2 shows a typical signal shield implementation. In FIG. 2, a logic stage (20) outputs a signal (22) that is shielded by a first wire (24) and a second wire (26), where the first wire (24) is operatively connected to logic high, i.e., a voltage source (28), and the second wire (26) is operatively connected to logic low, i.e., ground (30). The logic stage (20) is also connected to power supply terminals (36, 38); however, the power supply terminals (36, 38) of the logic stage (20) may be different from the power supply terminals (28, 30) of the shield wires (24, 26). In any event, the placement of the shield wires (24, 26) creates capacitances (32, 34) between the respective shield wires (24, 26) and the signal wire (22). In sum, because of such a signal shield implementation, other signals in close proximity to the signal (22) are not affected by the switching behavior of the signal (22) due to the fact that the signal (22) is shielded by wires (24, 26) that have constant values when the signal (22) switches state.

Referring now to FIG. 2b, when the signal (22) transitions from low to high, charge is delivered from the power supply terminal (36) of the logic gate (20) to the signal (22) and on to the second wire (26). As shown by the charge paths in FIG. 2b, charge flows through the capacitors (34) between the signal (22) and the second wire (26) to the ground terminal (30) of the second wire (26). Thus, in effect, the capacitors (34) between the signal (22) and the second wire (26) get charged. Alternatively, as shown by the discharge paths in FIG. 2b, the delivery of charge to the signal (22) causes the capacitors (32) between the signal (22) and the first wire (24) to discharge due to the capacitors (32) getting subjected to equal voltage terminals.

Referring now to FIG. 2c, when the signal (22) transitions from high to low, charge is delivered from the power supply terminal (28) of the first wire (28) to the signal (22) and to the ground terminal (38) of the logic gate (20). As shown by the charge paths in FIG. 2c, charge flows through the capacitors (32) between the first wire (24) and the signal (22) to the ground terminal (38) of the logic gate (20). Thus, in effect, the capacitors (32) between the first wire (24) and the signal (22) get charged. Alternatively, as shown by the discharge paths in FIG. 2c, the delivery of charge to the signal (22) causes the capacitors (34) between the signal (22) and the second wire (26) to discharge due to the capacitors (34) getting subjected to equal voltage terminals.

The charging events described above in the discussions with reference to FIGS. 2b and 2c involve charging events. Such charging event can cause power supply collapse. Power supply collapse, in addition to increasing the chances for power supply failure/malfunction, may adversely affect performance by increasing power consumption and/or by increasing propagation time along the signal (22). Thus, there is a need for reducing power supply collapse due to signal shielding.

SUMMARY OF INVENTION

According to one aspect of the present invention, an integrated circuit comprises pre-charge based circuitry that drives a signal, and a first wire having a voltage potential substantially equal to a final voltage potential of a dominant transition on the signal, where the first wire shields the signal.

According to another aspect, an integrated circuit comprises driving means for driving a value onto a signal and shielding means for shielding the signal such that the driving means participates in more discharge events than charging events.

According to another aspect, a method for assigning signal shields comprises determining a dominant switching direction of a signal, where the signal is driven by pre-charge based circuitry; and assigning a voltage potential to a first wire, where the voltage potential is substantially equal to a voltage potential of the signal after the signal transitions in the dominant switching direction, and where the first wire shields the signal.

Other aspects and advantages of the invention will be apparent from the following description and the appended claims.

BRIEF DESCRIPTION OF DRAWINGS

FIG. 2b shows charge flow during a low to high signal transition in the typical signal shield implementation shown in FIG. 2a.

FIG. 2c shows charge flow during a high to low signal transition in the typical signal shield implementation shown in FIG. 2a.

DETAILED DESCRIPTION

Embodiments of the present invention relate to a signal shielding technique for a signal driven by pre-charge based logic. Embodiments of the present invention further relate to a method and apparatus for reducing signal shielding induced power supply collapse.

More particularly, the present invention relates to a signal shielding technique in which shields are assigned such that pre-charge based logic that drives a signal is more likely, in an evaluation phase, to perform a discharge event on the signal than a charging event. A discharge event, as opposed to a charging event, requires the flow of current through local loops. Such discharge events do not cause or initiate power supply collapses that are typical with the occurrence of charging events. In other words, when pre-charge based logic is in the evaluation phase, it is more likely to perform discharge events than charging events, and thus, power supply collapse may be reduced. In order to ensure that the pre-charge based logic performs more discharge events in the evaluation phase than charging events, the present invention uses a technique that assigns voltages on shield wires depending on the behavior and properties of the pre-charge based logic.

Figure 1:
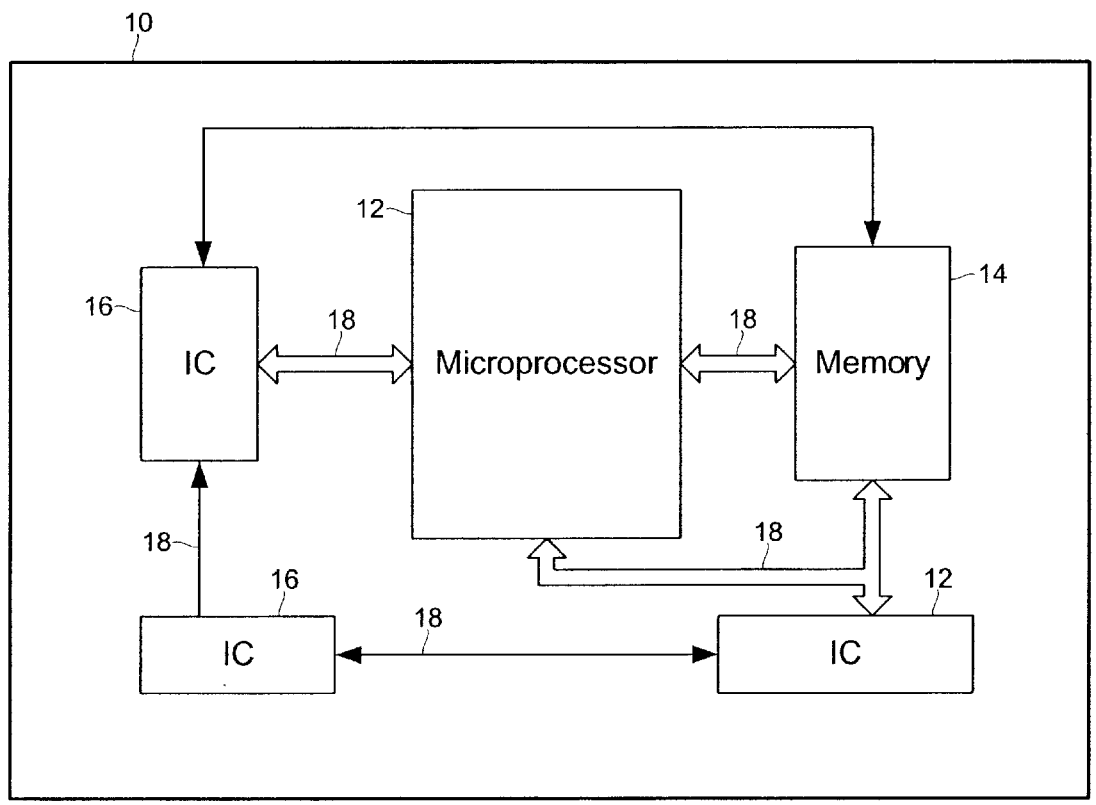
FIG. 1 shows a typical computer system.
Figure 2A:
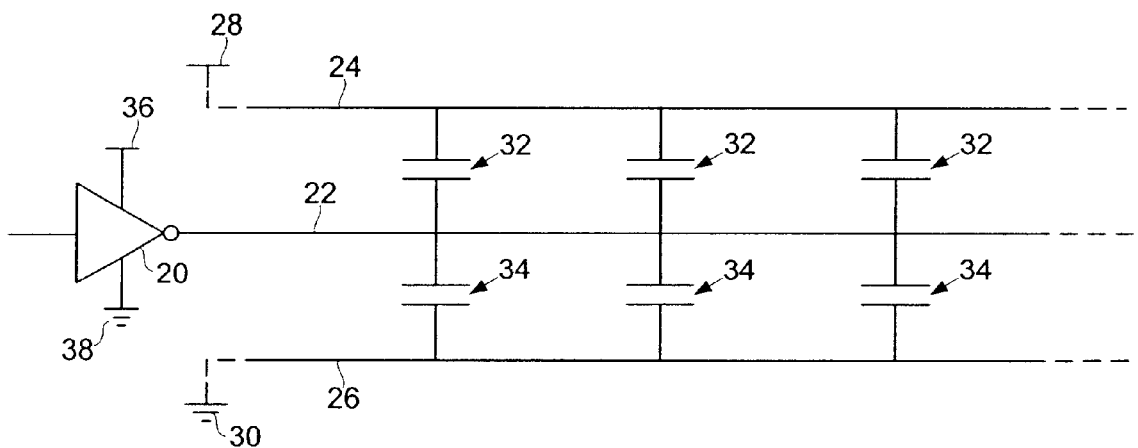
FIG. 2a shows a typical signal shield implementation.
Figure 2B:
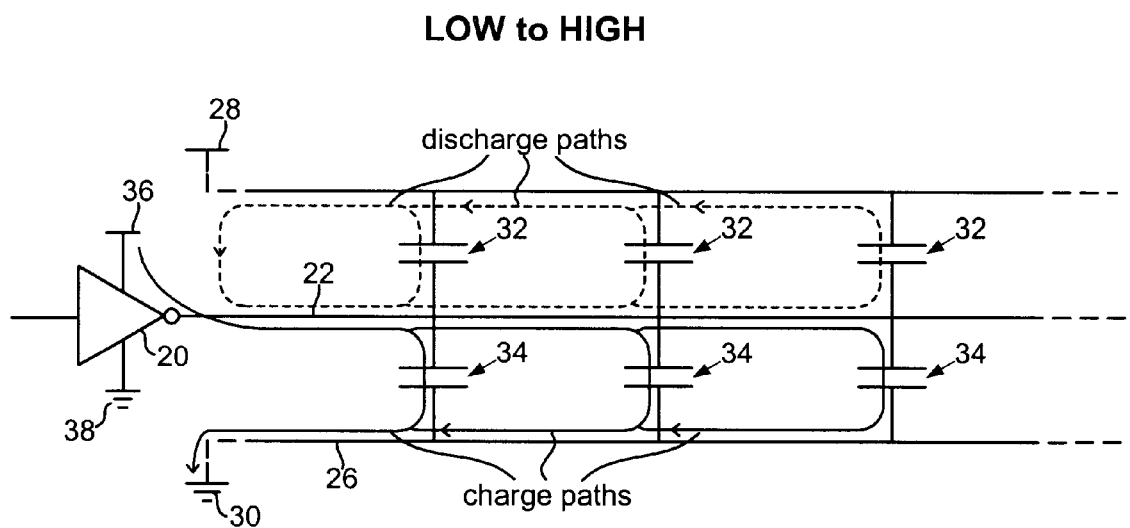
Figure 2C:
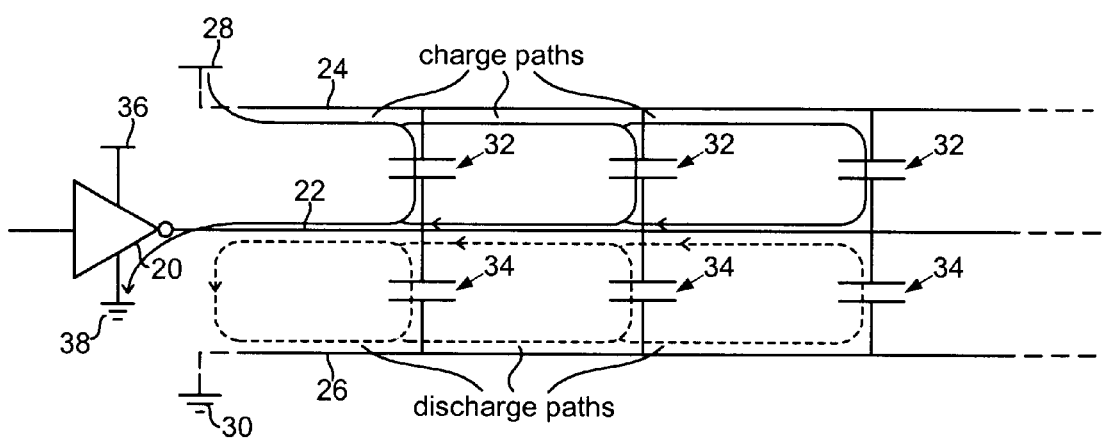
Figure 3:
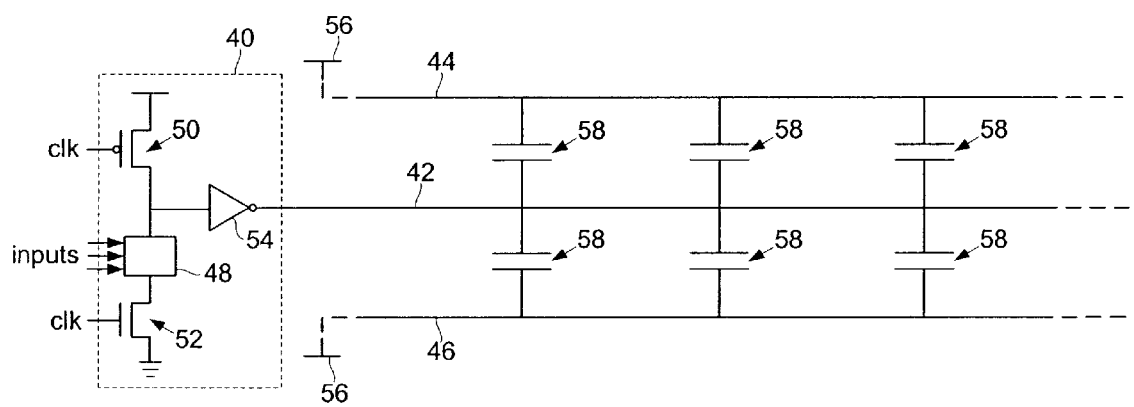
FIG. 3 shows a signal shielding implementation in accordance with an embodiment of the present invention.

FIG. 3 shows an exemplary signal shielding technique in accordance with an embodiment of the present invention. In FIG. 3, a pre-charge logic stage (40) drives a signal (42) shielded by a first wire (44) and second wire (46). The pre-charge logic stage (40) is formed by an evaluation stage (48), a pre-charge transistor (50), a pull-down transistor (52), and an inverter (54). Data inputs (shown in FIG. 3 as inputs) serve as inputs to the evaluation stage (48). The pre-charge transistor (50) and the pull-down transistor (52) are controlled by a clock signal (shown in FIG. 3 as clk).

When the clock signal goes low, the pre-charge logic stage (40) enters a pre-charge phase in which the pre-charge transistor (50) switches 'on.' As the pre-charge transistor (50) switches 'on,' a high voltage potential becomes present at the input to the inverter (54), which, in turn, outputs low onto the signal (42). When the clock signal goes high, the pre-charge logic stage (40) enters an evaluation phase in which the pre-charge transistor (50) switches 'off' and the pull-down transistor (52) switches 'on.' If, at the beginning of the evaluation phase, the evaluation stage (48) evaluates to a value that causes it to conduct current, a low voltage potential becomes present at the input to the inverter (54), which, in turn outputs high onto the signal (42). Otherwise, if, at the beginning of the evaluation phase, the evaluation stage (48) does not evaluate to a value that causes it to conduct current, the inverter (54) continues to output low onto the signal (42).

With reference to FIG. 3, it is important to note that, in the evaluation phase, the transition on a signal wire from low to high should be as fast as possible. Accordingly, the present invention describes a technique that makes such a transition, the 'dominant switching direction,' a discharge event.

To effectively reduce power supply collapse during transitions on the signal (42), the first and second wires (44, 46) are operatively connected to a voltage potential substantially equal to a final voltage potential of the dominant transition; in this case, a high voltage potential, e.g., a voltage source (56). Thus, because the signal (42) is more likely to transition to high than to low, transitions on the signal (42) are more likely to cause discharge events than charging events. For example, when the signal (42) transitions to high, the voltage potential difference between the signal (42) and the first and second wire (44, 46) decreases, effectively discharging capacitors (58) positioned between the signal (42) and the first and second wires (44, 46).

Figure 4:
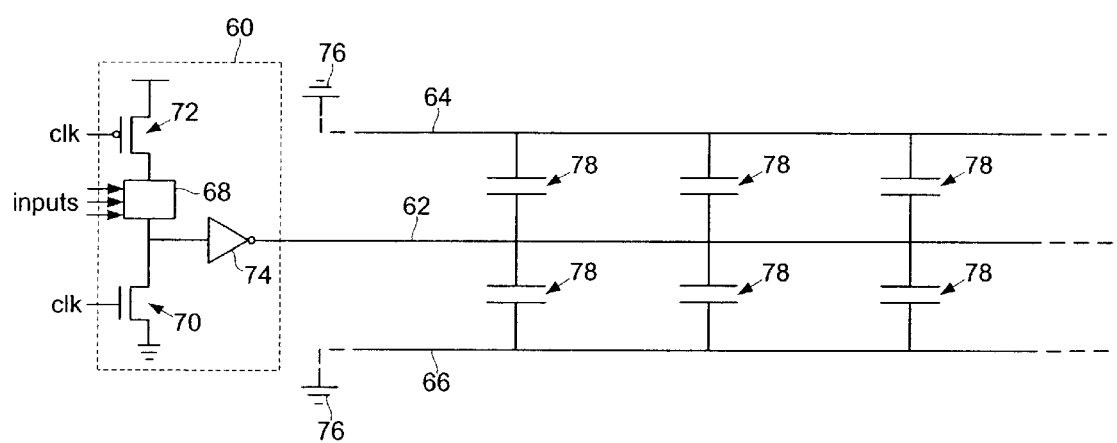
FIG. 4 shows a signal shielding implementation in accordance with another embodiment of the present invention.

FIG. 4 shows an exemplary signal shielding technique in accordance with another embodiment of the present invention. In FIG. 4, a pre-charge logic stage (60) drives a signal (62) shielded by a first wire (64) and second wire (66). The pre-charge logic stage (60) is formed by an evaluation stage (68), a discharge transistor (70), a pull-up transistor (72), and an inverter (74). Data inputs (shown in FIG. 4 as inputs) serve as inputs to the evaluation stage (68). The discharge transistor (70) and the pull-up transistor (72) are controlled by a clock signal (shown in FIG. 4 as clk).

When the clock signal goes high, the pre-charge logic stage (60) enters a pre-charge phase in which the discharge transistor (70) switches 'on.' As the discharge transistor (70) switches 'on,' a low voltage potential becomes present at the input to the inverter (74), which, in turn, outputs high onto the signal (62). When the clock signal goes low, the discharge logic stage (60) enters an evaluation phase in which the discharge transistor (70) switches 'off' and the pull-up transistor (72) switches 'on.' If, at the beginning of the evaluation phase, the evaluation stage (68) evaluates to a value that causes it to conduct current, a high voltage potential becomes present at the input to the inverter (74), which, in turn outputs low onto the signal (62). Otherwise, if, at the beginning of the evaluation phase, the evaluation stage (68) does not evaluate to a value that causes it to conduct current, the inverter (74) continues to output high onto the signal (62).

With reference to FIG. 4, it is important to note that, in the evaluation phase, the transition on a signal wire from high to low should be as fast as possible. Accordingly, the present invention describes a technique that makes such a transition, the 'dominant switching direction,' a discharge event.

To effectively reduce power supply collapse during transitions on the signal (62), the first and second wires (64, 66) are operatively connected to a voltage potential substantially equal to a final voltage potential of the dominant transition; in this case, a low voltage potential, e.g., ground (76). Thus, because the signal (62) is more likely to transition to low than to high, transitions on the signal (62) are more likely to cause discharge events than charging events. For example, when the signal (62) transitions to low, the voltage potential difference between the signal (62) and the first and second wire (64, 66) decreases, effectively discharging capacitors (78) positioned between the signal (62) and the first and second wires (64, 66).

Those skilled in the art will appreciate that other embodiments of the present invention may be implemented based on pre-charge logic circuitry different from that shown in FIGS. 3 and 4. The present invention assigns shield wire voltage potentials based on the behavior of the pre-charge logic that drives the signal the shield wires shield.

Advantages of the present invention may include one or more of the following. In some embodiments, because wires used to shield a signal driven by pre-charge based logic are assigned voltages in accordance with the dominant transition on the signal, power supply collapses during signal switching may be reduced.

In some embodiments, because a voltage potential of wires shielding a signal is equal to a final voltage potential of a dominant switching direction of the signal, capacitance between the signal and shield wires may be discharged by the signal during the dominant transition, effectively improving system performance.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   pre-charge based circuitry that drives a signal; and
   a first wire assigned a voltage potential based on a dominant transition of the signal, wherein the voltage potential of the first wire is substantially equal to a final voltage potential of the dominant transition, and wherein the first wire shields the signal.

2. The integrated circuit of claim 1, further comprising a second wire having a voltage potential substantially equal to the final voltage potential of the dominant transition on the signal, wherein the second wire shields the signal.

3. The integrated circuit of claim 1, wherein the dominant transition on the signal is a dominant switching direction of the signal.

4. The integrated circuit of claim 1, wherein the dominant transition is based on the pre-charge based circuitry.

5. The integrated circuit of claim 1, further comprising a capacitor having one terminal operatively connected to the first wire and another terminal connected to the signal, wherein the capacitor is discharged when the signal transitions to the final voltage potential of the dominant transition.

6. An integrated circuit, comprising:
   driving means for driving a value onto a signal; and
   shielding means for shielding the signal, wherein the shielding means is assigned a voltage potential such that the driving means participates in a discharge event during a dominant transition of the signal.

7. An method for assigning signal shields, comprising:
   determining a dominant switching direction of a signal, wherein the signal is driven by pre-charge based circuitry; and
   assigning a voltage potential to a first wire based on the dominant switching direction, wherein the voltage potential is substantially equal to a voltage potential of the signal after the signal transitions in the dominant switching direction, and wherein the first wire shields the signal.

8. The method of claim 7, further comprising assigning a voltage potential to a second wire, wherein the voltage potential is substantially equal to the voltage potential of the signal after the signal transitions in the dominant switching direction, and wherein the second wire shields the signal.

9. The method of claim 7, wherein the dominant switching direction is based on the pre-charge based circuitry.

10. The method of claim 7, wherein a capacitor having one terminal is operatively connected to the first wire and another terminal is connected to the signal, wherein the capacitor is discharged when the signal transitions in the dominant switching direction.

* * * * *